(12) United States Patent
Kadoi et al.

(10) Patent No.: US 11,694,871 B2
(45) Date of Patent: Jul. 4, 2023

(54) CHARGED PARTICLE BEAM DEVICE

(71) Applicant: Hitachi High-Tech Corporation, Tokyo (JP)

(72) Inventors: Ryo Kadoi, Tokyo (JP); Wen Li, Tokyo (JP); Naoya Ishigaki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 53 days.

(21) Appl. No.: 17/394,604

(22) Filed: Aug. 5, 2021

(65) Prior Publication Data

US 2022/0059312 A1     Feb. 24, 2022

(30) Foreign Application Priority Data

Aug. 20, 2020 (JP) ................................ 2020-139062

(51) Int. Cl.
    *H01J 37/20*     (2006.01)
    *H01L 21/683*    (2006.01)
    *H01J 37/22*     (2006.01)

(52) U.S. Cl.
    CPC ............ *H01J 37/20* (2013.01); *H01J 37/222* (2013.01); *H01L 21/6831* (2013.01); *H01J 2237/2007* (2013.01)

(58) Field of Classification Search
    CPC .............. H01J 37/20; H01J 2237/2007; H01L 21/6831
    See application file for complete search history.

(56) References Cited

U.S. PATENT DOCUMENTS

| 5,872,694 | A  | 2/1999 | Hoinkis et al. |
| 8,680,466 | B2 | 3/2014 | Kanno et al. |

(Continued)

FOREIGN PATENT DOCUMENTS

| JP | H11-251420 A   | 9/1999 |
| JP | 4009009 B2     | 11/2007 |
| WO | 2010097858 A1  | 9/2010 |

OTHER PUBLICATIONS

Office Action dated Feb. 13, 2023 in Korean Application No. 10-2021-0087578.

*Primary Examiner* — Eliza W Osenbaugh-Stewart
(74) *Attorney, Agent, or Firm* — Miles & Stockbridge, P.C.

(57) ABSTRACT

Provided is a charged particle beam device capable of improving the accuracy of measurement and processing. The charged particle beam device includes an electrostatic chuck that adsorbs an inspection object, a voltage generation unit that generates a voltage to be supplied to the electrostatic chuck, and a state determination unit that determines a state of the inspection object. Here, the state determination unit includes a current waveform simulation unit that simulates a time-series change of an electrostatic chuck current flowing through the voltage generation unit when the electrostatic chuck normally adsorbs the inspection object, a difference integration unit that acquires an integration value of a difference between a time-series change of a simulation current generated by the current waveform simulation unit and the time-series change of the electrostatic chuck current flowing through the voltage generation unit, and a difference determination unit that determines an adsorption state of the inspection object and a shape feature of the inspection object based on the integration value of the difference.

7 Claims, 11 Drawing Sheets

(56) References Cited

U.S. PATENT DOCUMENTS

2012/0256087 A1* 10/2012 Kanno .................... H01J 37/20
361/234
2014/0091232 A1* 4/2014 Ohsawa ................ H02N 13/00
250/442.11
2015/0303092 A1* 10/2015 Kawabata .............. G01R 19/25
361/234

* cited by examiner

NORMAL STATE

AT THE TIME OF CLOGGING OF FOREIGN MATTER

AT THE TIME OF DISTORTION

AT THE TIME OF CLOGGING OF FOREIGN MATTER

AT THE TIME OF DISTORTION

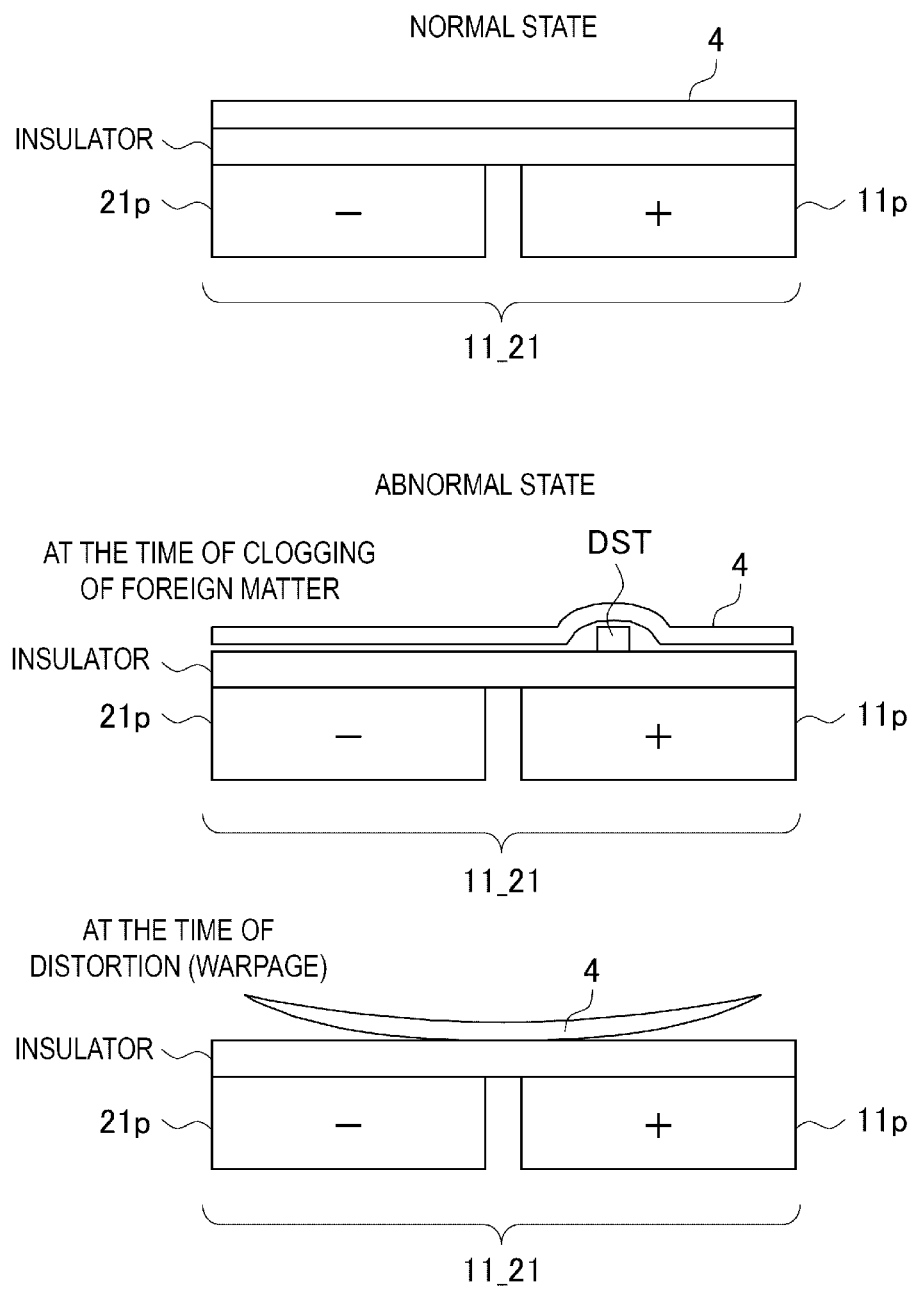

CHARGED PARTICLE BEAM DEVICE

BACKGROUND OF THE INVENTION

1. Field of the Invention

The present invention relates to a charged particle beam device, and particularly, to a charged particle beam device including an electrostatic chuck that adsorbs (chucks) an object.

2. Description of the Related Art

A device including an electrostatic chuck is described in, for example, Patent Literature 1 (Japanese Patent No. 4009009). In Patent Literature 1, a vacuum treatment device is indicated as a device including an electrostatic chuck, and the electrostatic chuck is described as an electrostatic chuck plate.

In Patent Literature 1, a value of a first pulse current flowing when a voltage is applied to the electrostatic chuck plate in advance in a state where a substrate is not disposed on the electrostatic chuck plate and a value of a second pulse current flowing when the substrate is disposed on the electrostatic chuck plate in a normal state, a voltage is applied to the electrostatic chuck plate, and absorption is started are measured. A difference between the value of the first pulse current and the value of the second pulse current that are obtained by the measurement is set as a reference current value. Patent Literature 1 discloses that in an actual treatment, a value of a third pulse current flowing when a voltage is applied to the electrostatic chuck plate and absorption is started is measured, a difference between the value of the third pulse current and the value of the first pulse current is set as a measured current value, and whether the substrate is normally absorbed is determined according to the measured current value and the reference current value.

A charged particle beam device is used for measurement and processing of an object, but the accuracy of measurement and processing changes depending on the state of the object. For example, when the state of the object is abnormal, the accuracy deteriorates. The types of the abnormality include, for example, distortion of the object (for example, warpage or the like of the object), clogging of foreign matter in which a foreign matter is sandwiched between an electrostatic chuck absorbing the object and the object, and an oxide film formed on a main surface of the object.

Therefore, in order to improve the accuracy of measurement and processing, it is desirable to determine the state of the object in advance and perform measurement and processing according to the state.

In addition, in Patent Literature 1, the state of the object is not considered.

SUMMARY OF THE INVENTION

An object of the invention is to provide a charged particle beam device capable of improving the accuracy of measurement and processing.

Other objects and novel features of the invention will become clear according to the descriptions in the description and the accompanying drawings.

An outline of a representative embodiment of embodiments disclosed in the present application will be briefly described as follows.

That is, the charged particle beam device includes an electrostatic chuck that adsorbs an inspection object, a first voltage generation unit that generates a voltage to be supplied to the electrostatic chuck, and a first state determination unit that determines a state of the inspection object. Here, the first state determination unit includes a first current waveform simulation unit that simulates a time-series change of an electrostatic chuck current flowing through the first voltage generation unit when the electrostatic chuck normally adsorbs the inspection object, a first difference integration unit that acquires an integration value of a difference between a time-series change of a simulation current generated by the first current waveform simulation unit and the time-series change of the electrostatic chuck current flowing through the first voltage generation unit, and a first determination unit that determines a state of the inspection object at the time of adsorption and a shape feature of the inspection object based on the integration value of the difference.

To briefly describe the effect obtained by the representative embodiment of the invention disclosed in the present application, a charged particle beam device capable of improving the accuracy of measurement and processing can be provided.

BRIEF DESCRIPTION OF THE DRAWINGS

FIG. 11 is a diagram illustrating a state of an object.

DESCRIPTION OF THE PREFERRED EMBODIMENTS

Embodiments will be described with reference to the drawings. In addition, the embodiments described below do not limit the inventions according to the scope of claims, and all of the elements and combinations thereof described in the embodiments are not necessarily essential to the solution of the invention.

In the following description, a semiconductor wafer will be described as an example of an object (sample) of a charged particle beam device, and a semiconductor inspection device that inspects the semiconductor wafer will be described as an example of the charged particle beam device, but the invention is not limited thereto.

First Embodiment

<Overall Configuration of Charged Particle Beam Device and State of Object>

Figure 1:
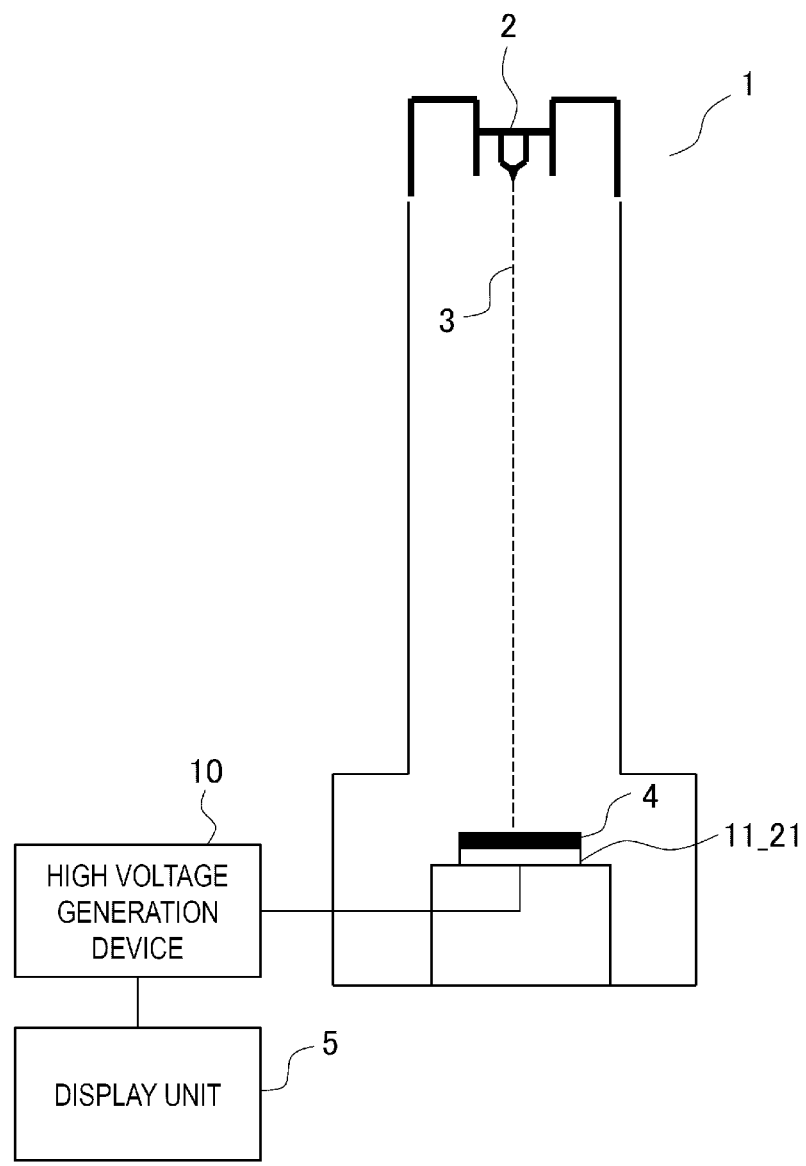
FIG. 1 is a block diagram illustrating an overall configuration of a charged particle beam device according to a first embodiment.

FIG. 1 is a block diagram illustrating an overall configuration of a charged particle beam device according to the first embodiment. Although the charged particle beam device includes a plurality of functional blocks, FIG. 1 merely illustrates the functional blocks necessary for the description. In this figure, 1 indicates the charged particle beam device. The charged particle beam device 1 includes a charged particle source 2, a display unit 5, a high voltage generation device 10, and an electrostatic chuck 11_21. Further, in FIG. 1, 4 indicates the object, and FIG. 1 illustrates a state in which the object 4 is fixed to the charged particle beam device 1.

In the charged particle beam device 1, a charged particle beam 3 is output from the charged particle source 2. The object 4 as an irradiation object is irradiated with the output charged particle beam 3. The electrostatic chuck 11_21 generates an electrostatic force by using a high voltage from the high voltage generation device 10 as an electrostatic source, adsorbs a sample that is the object 4 by the electrostatic force, and fixes the sample on the electrostatic chuck 11_21. The display unit 5 is connected to the high voltage generation device 10, and displays an alert and outputs a log based on information from the high voltage generation device 10.

Here, a case where a scanning electron microscope (SEM) is used as the charged particle beam device 1 and a semiconductor wafer is used as the object (sample) 4 as described above will be described as an example, but the invention is not limited thereto.

Next, a state of the object 4 will be described with reference to the drawing. FIG. 11 is a diagram illustrating a state of an object. FIG. 11 illustrates a state in which the object 4 is normally adsorbed to the electrostatic chuck 11_21 (a normal state) and a state in which the object 4 is not normally adsorbed to the electrostatic chuck 11_21 (an abnormal state).

The electrostatic chuck 11_21 includes a +electrode (positive electrode) 11p to which a positive high voltage is supplied at the time of adsorption, a −electrode (opposite electrode) 21p to which a negative high voltage is supplied at the time of adsorption, and an insulator disposed on the +electrode 11p and the −electrode 21p.

In the normal state, a main surface of the object 4 is adsorbed so as to be in close contact with the insulator by the adsorption. Accordingly, a distance between the charged particle source 2 and the object 4 is substantially uniform.

On the other hand, as indicated as the time of clogging of foreign matter, when a foreign matter DST is sandwiched between the object 4 and the insulator, the distance between the charged particle source 2 and the object 4 changes at the portion where the foreign matter DST is sandwiched, and the accuracy of measurement and processing is reduced. Further, as indicated as the time of distortion (warpage), when the object 4 is deformed (shape feature), the distance to the charged particle source 2 changes at the central portion and the peripheral portion of the object 4, and the accuracy of measurement and processing is reduced.

According to the first embodiment, it is possible to determine what kind of abnormality of state occurs by the high voltage generation device 10. Next, the high voltage generation device 10 will be described with reference to the drawings.

<High Voltage Generation Device>

Figure 2:
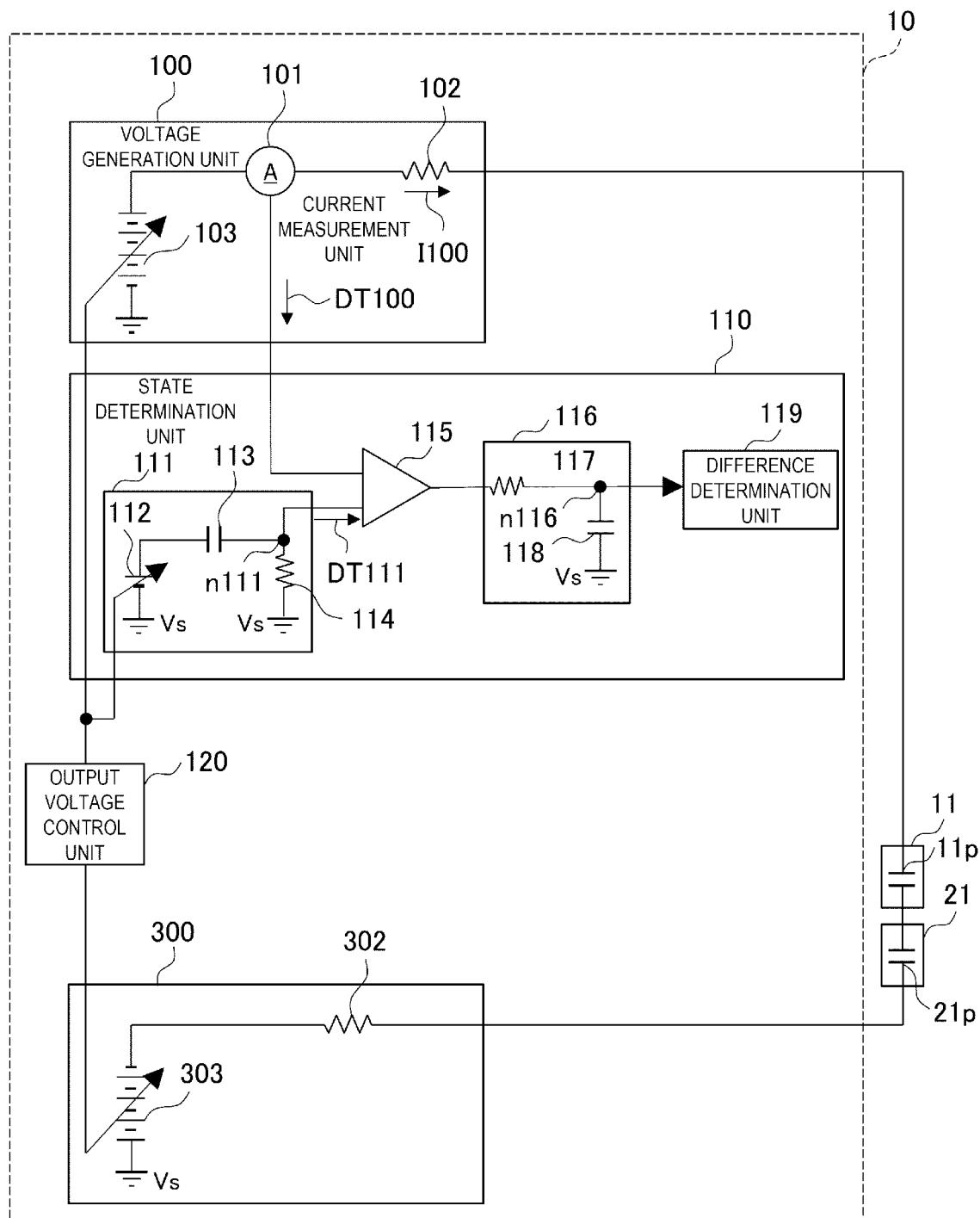
FIG. 2 is a circuit diagram illustrating a configuration of a high voltage generation device according to the first embodiment.

FIG. 2 is a circuit diagram illustrating a configuration of a high voltage generation device according to the first embodiment. In FIGS. 2, 11 and 21 indicate the electrostatic chuck 11_21. That is, the electrostatic chuck 11_21 illustrates an equivalent circuit configured by two capacitors connected in series. Here, the electrode 11p of the capacitor indicates the +electrode 11p indicated in FIG. 11, and the electrode 21p of the capacitor indicates the −electrode 21p indicated in FIG. 11.

The high voltage generation device 10 includes a positive voltage generation unit (a first voltage generation unit) 100, a state determination unit (a first state determination unit) 110, a negative (opposite) voltage generation unit 300, and an output voltage control unit 120.

The positive voltage generation unit 100 includes a current measurement unit 101, an output resistance 102, and a voltage source 103. The positive electrode of the voltage source 103 is connected to the +electrode 11p of the electrostatic chuck 11_21 via the current measurement unit 101 and the output resistance 102, and the negative electrode of the voltage source 103 is connected to a ground voltage Vs. The voltage source 103 is controlled by the output voltage control unit 120. When the object 4 is adsorbed to the electrostatic chuck 11_21, the output voltage control unit 120 controls the voltage source 103 to supply a positive high voltage to the +electrode 11p of the electrostatic chuck via the current measurement unit 101 and the output resistance 102. Accordingly, a current (electrostatic chuck current) I100 for adsorbing the object 4 flows through the current measurement unit 101 and the output resistance 102. That is, when the object 4 is adsorbed by the electrostatic chuck 11_21, the electrostatic chuck current I100 flows through the voltage generation unit 100. The current measurement unit 101 measures the electrostatic chuck current I100 and forms a measurement signal (measurement current) DT100 of a value corresponding to the electrostatic chuck current I100. That is, when the electrostatic chuck current I100 changes in time series with the lapse of time, the value of the measurement signal DT100 also changes in time series according to the time-series change of the electrostatic chuck current I100. In addition, the output resistance 102 is a resistance for current limitation.

The state determination unit 110 includes a current waveform simulation unit (a first current waveform simulation unit) 111, a difference output unit (a first difference output unit) 115, a difference integration unit (a first difference integration unit) 116, and a difference determination unit (a first determination unit) 119.

The current waveform simulation unit 111 includes a voltage source 112, a capacitor 113, and a resistance 114. The negative electrode of the voltage source 112 is connected to the ground voltage Vs, and the positive electrode is connected to the ground voltage Vs via the capacitor 113 and the resistance 114. A connection node n111 that connects the capacitor 113 and the resistance 114 becomes the output of the current waveform simulation unit 111, and outputs the simulation signal (simulation current) DT111.

The voltage source 112 is controlled by the output voltage control unit 120 so as to interlock with the voltage source 103. That is, when the voltage source 103 outputs a positive high voltage, the voltage source 112 is controlled by the output voltage control unit 120 such that the voltage source 112 also outputs a voltage substantially at the same time. The voltage source 103 outputs a high voltage since the voltage source 103 is used to adsorb the object 4, but since the voltage source 112 is not used to adsorb the object 4, the voltage source 112 outputs a voltage lower than the voltage output by the voltage source 103 (a voltage having a small absolute value). The voltage from the voltage source 112 is supplied to the resistance 114 via the capacitor 113, and the connection node n111 between the capacitor 113 and the resistance 114 becomes the output, and thus, a CR differentiation circuit is configured by the capacitor 113 and the resistance 114. In addition, in this differentiation circuit, the capacitor 113 may be a resistance, and the resistance 114 may be a coil. That is, an RL differentiation circuit may be used as the differentiation circuit.

The current waveform simulation unit 111 simulates the electrostatic chuck current I100 when the electrostatic chuck 11_21 normally adsorbs the object 4. More specifically, constants (values of the capacitor 113 and the resistance 114) of the CR differentiation circuit are set so as to form the simulation signal DT111 simulating the measurement signal DT100 that changes in time series according to the time-series change of the electrostatic chuck current I100.

The measurement signal DT100 and the simulation signal DT111 are supplied to the difference output unit 115. The difference output unit 115 outputs a difference between the measurement signal DT100 and the simulation signal DT111. That is, a difference between a time-series change of the measurement signal DT100 and a time-series change of the simulation signal DT111 is output from the difference output unit 115 in time series.

The output of the difference output unit 115 is supplied to a difference integration unit 116 including a resistance 117 and a capacitor 118. Here, the resistance 117 and the capacitor 118 are connected in series between the output of the difference output unit 115 and the ground voltage Vs in this order, and a connection node n116 connecting the resistance 117 to the capacitor 118 becomes the output of the difference integration unit 116. That is, an RC integration circuit is constituted of the resistance 117 and the capacitor 118. As a result, a value output from the difference output unit 115 is temporally integrated by the difference integration unit 116, and the integration value is supplied from the difference integration circuit 116 to the difference determination unit 119. The difference determination unit 119 determines the state of the object 4 based on the value that is supplied from the difference integration unit 116 and changes in time series. The state determined by the difference determination unit 119 is displayed, for example, as an alert by the display unit 5. Further, the state of the charged particle beam device 1 is adjusted according to the determined state. In addition, the integration circuit part including the resistance 117 and the capacitor 118 may be constituted of an LR integration circuit in which the resistance 117 is a coil and the capacitor 118 is a resistance.

In FIG. 2, the negative voltage generation unit 300 includes a voltage source 303 and an output resistance 302. The positive electrode of the voltage source 303 is connected to the ground voltage Vs, and the negative electrode is connected to the −electrode 21*p* of the electrostatic chuck 11_21 via the output resistance 302. The voltage source 303 is also controlled by the output voltage control unit 120 so as to interlock with the voltage sources 103 and 112. That is, the voltage source 303 is controlled by the output voltage control unit 120 such that the voltage source 303 outputs a negative high voltage to the −electrode 21*p* substantially at the same time when the voltage source 103 outputs a positive high voltage to the +electrode 11*p*. In addition, the output resistance 302 is a resistance for current limitation.

<Measurement Signal DT100 and Simulation Signal DT111>

Next, the measurement signal DT100 and the simulation signal DT111 will be described with reference to the drawings. Since the measurement signal DT100 changes according to the time-series change of the electrostatic chuck current I100, the measurement signal DT100 can be regarded as indicating the time-series change of the electrostatic chuck current I100.

Figure 3A:
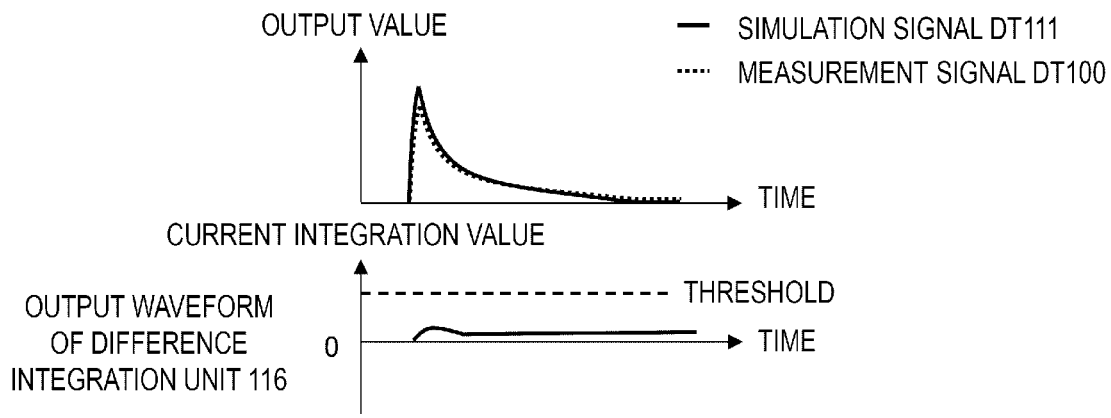
FIGS. 3A to 3C are waveform diagrams illustrating time-series changes of a measurement signal and a simulation signal according to the first embodiment.
Figure 3B:
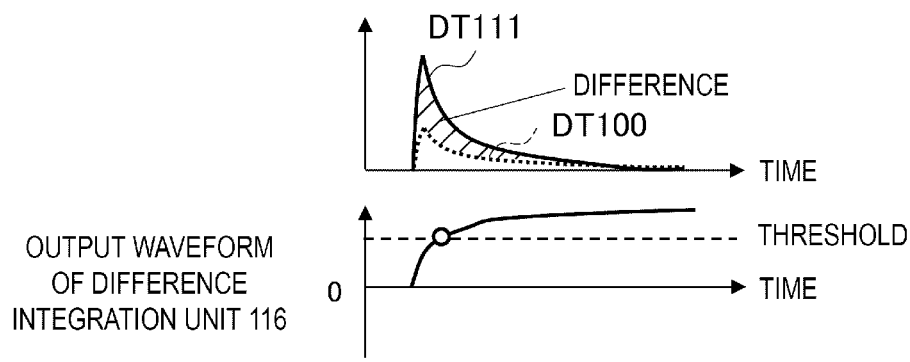
Figure 3C:
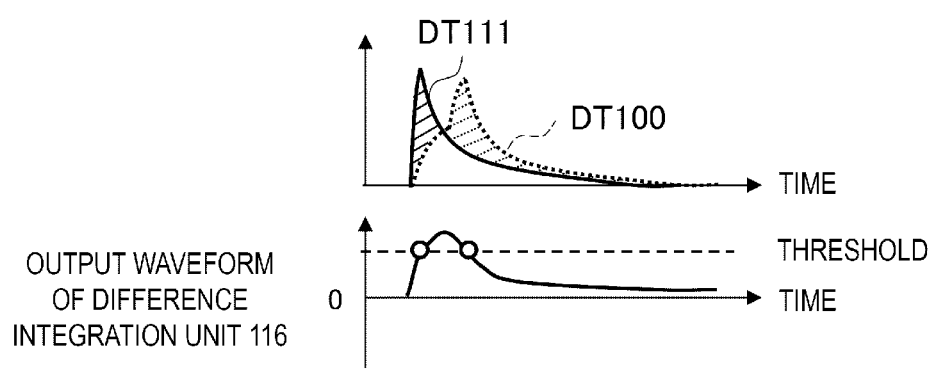

FIGS. 3A to 3C are waveform diagrams illustrating the time-series changes of the measurement signal (the output of the current measurement unit 101) and the simulation signal (the output of the current waveform simulation unit 111) according to the first embodiment. Here, FIG. 3A illustrates a waveform in the normal state, FIG. 3B illustrates a waveform at the time of clogging of foreign matter, and FIG. 3C illustrates a waveform at the time of distortion. Here, an example of the state of the object in the normal state, at the time of clogging of foreign matter, and at the time of distortion is illustrated in FIG. 11 previously described. FIGS. 3A to 3C illustrate the measurement signal DT100, the simulation signal DT111, and output waveforms of the difference integration unit 116 in each state.

The time-series change of the measurement signal DT100 changes according to the state of the object 4. On the other hand, the simulation signal DT111 maintains the time-series change in the normal state without depending on the state of the object 4.

In the normal state indicated in FIG. 3A, the time-series change (a waveform shape) of the measurement signal DT100 and the time-series change (a waveform shape) of the simulation signal DT111 with the lapse of time are substantially equal to each other. The difference integration unit 116 outputs, as an output waveform, a value obtained by integrating the difference between the two waveforms at every minute time. In the normal state, since there is almost no difference between the measurement signal DT100 and the simulation signal DT111, the output waveform of the difference integration unit 116 is close to 0.

On the other hand, at the time of clogging of foreign object and at the time of distortion, the output waveform of the difference integration unit 116 indicates a different shape.

First, at the time of clogging of foreign object as indicated in FIG. 3B, an amplitude of the electrostatic chuck current I100 flowing through the voltage generation unit 100 becomes smaller than that in the normal state. As a result, the measurement signal DT100 also has a waveform shape having a smaller amplitude than that in the normal state. Therefore, the output waveform of the difference integration unit 116 has a waveform shape in which the amplitude increases with the lapse of time.

Meanwhile, at the time of distortion indicated in FIG. 3C, the time (peak appearance time) at which the amplitude of the electrostatic chuck current I100 flowing through the voltage generation unit 100 reaches the peak is later than that in the normal state. Therefore, the output waveform of the difference integration unit 116 has a waveform shape in which the amplitude increases at first and then decreases. As described above, the features of the output waveforms of the difference integration unit 116 are different depending on the state of the object 4.

Therefore, by setting a certain threshold as illustrated in FIGS. 3A to 3*c* and comparing the output waveform of the difference integration unit 116 with the threshold in the difference determination unit 119, it is possible to determine whether the state is in the normal state, at the time of clogging of foreign matter, or at the time of distortion. That is, if the output waveform of the difference integration unit 116 does not exceed the threshold, it is possible to determine that the state is in the normal state. On the other hand, when the output waveform of the difference integration unit 116 continues to exceed the threshold, it is possible to determine that the state is at the time of clogging of foreign matter. Further, when the output waveform of the difference integration unit 116 once exceeds the threshold and then decreases to the threshold or less, it is possible to determine that the state is at the time of distortion.

<Operation Example>

Figure 4:
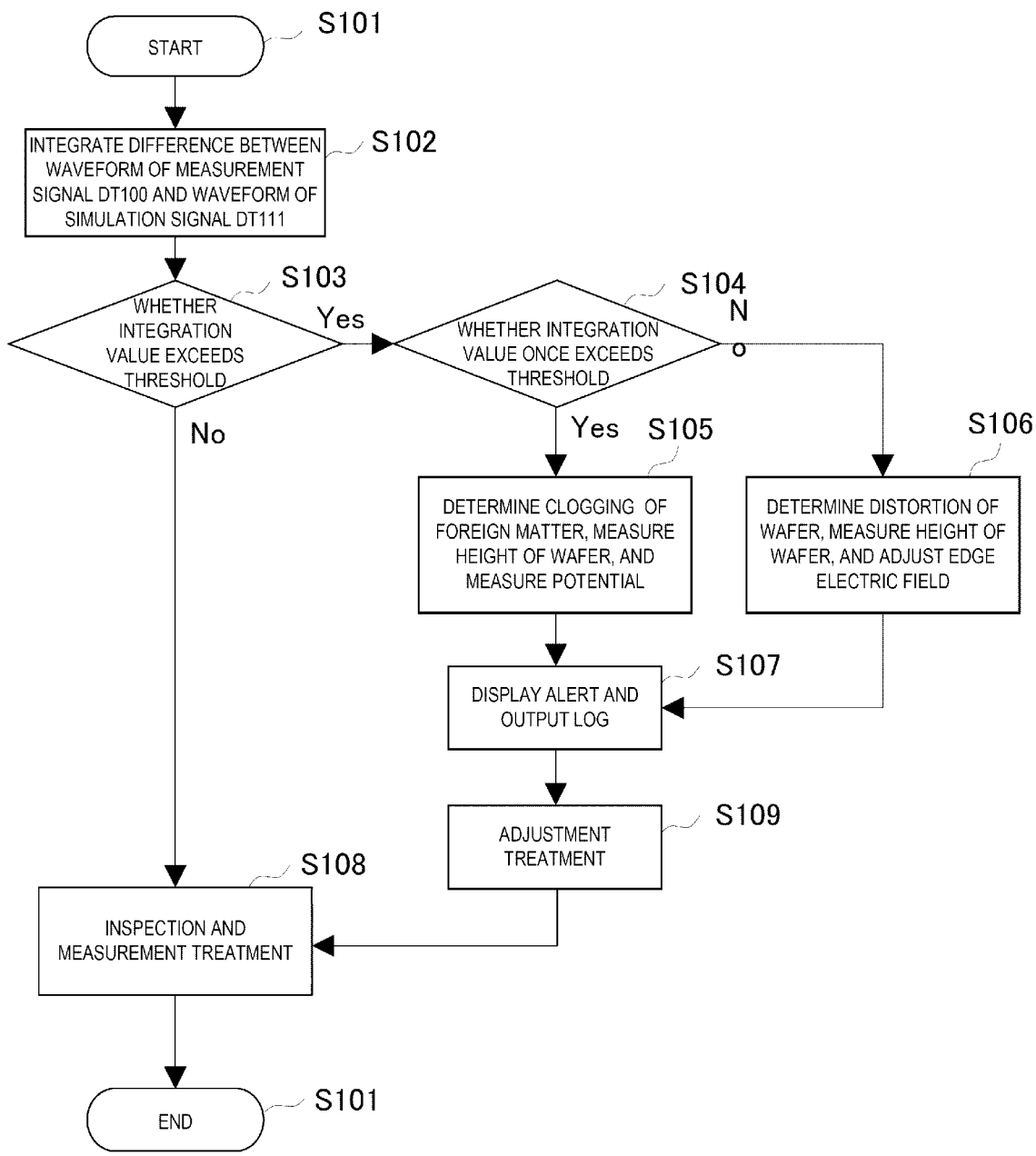
FIG. 4 is a flowchart diagram illustrating operations of the charged particle beam device according to the first embodiment.

FIG. 4 is a flowchart diagram indicating operations of the charged particle beam device according to the first embodiment.

In step S101, an electrostatic chuck operation is started. In step S102, a difference between the measurement signal DT100 and the simulation signal DT111 is integrated. In step S103, it is determined whether an integration value obtained in step S102 exceeds the threshold. When it is determined that the integration value does not exceed the threshold, the semiconductor wafer that is the object 4 is determined to be in a normal state, and next, step S108 is executed.

In step S108, normal inspection and measurement treatments are executed by the charged particle beam device 1, and in step S110, the electrostatic chuck operation and the treatments by using the charged particle beam device 1 are ended.

On the other hand, when it is determined that the integration value exceeds the threshold in step S103, step S104 is executed next. In step S104, it is determined whether the integration value once exceeds the threshold. If the integration value remains exceeding the threshold, step S105 is executed next. In step S105, it is determined that the state of clogging of foreign matter occurs. In this case, a part of the semiconductor wafer that is the object 4 is lifted from above the electrostatic chuck 11_21 due to the presence of the foreign matter as indicated in FIG. 11, the distance to the charged particle source 2 (FIG. 1) changes from a predetermined distance. Therefore, in step S105, the height of the semiconductor wafer and the potential distribution in the semiconductor wafer are measured.

In step S107 following step S105, the display unit 5 (FIG. 1) displays an alert and outputs a log. In this case, the state of clogging of foreign matter as well as the measured height and the potential distribution of the semiconductor wafer are output as, for example, an alert display and a log.

Following step S107, step S109 is executed. In step S109, a treatment of adjusting the charged particle beam device 1 is executed according to the height and the potential distribution of the semiconductor wafer measured in step S105. The charged particle beam device 1 adjusted in step S105 executes the inspection and measurement treatments in step S108, and ends the inspection and measurement treatments in step S110.

Figure 5:
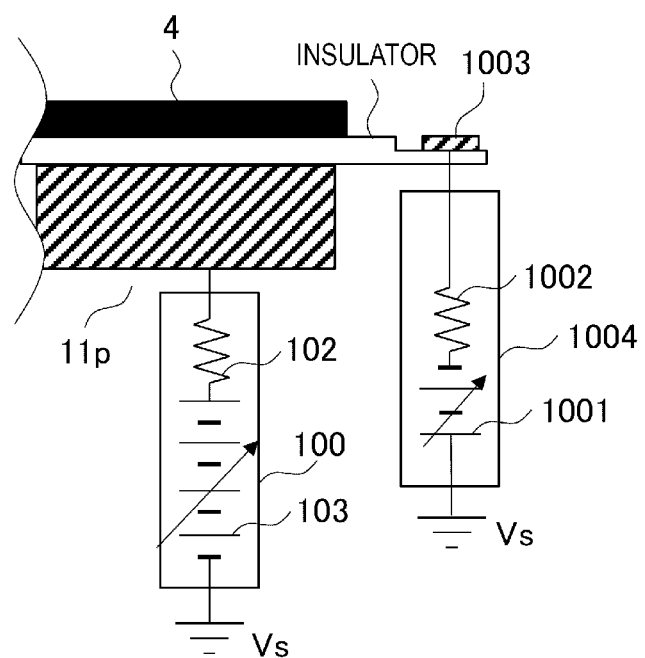
FIG. 5 is a diagram illustrating an edge electric field adjustment according to the first embodiment.

In step S104, when it is determined that the integration value does not remain exceeding the threshold and decreases to the threshold or less with the lapse of time, step S106 is executed next. In this case, in step S106, it is determined that a state of distortion occurs. Even in the state of distortion, a part of the semiconductor wafer is lifted from above the electrostatic chuck 11_21 as indicated in FIG. 11, and thus the height of the semiconductor wafer is also measured in step S106 in the same manner as in step S105. Further, in step S106, the edge electric field adjustment, which will be described later with reference to FIG. 5, is executed.

In step S107 after step S106, alert display and log output are executed. In this case, the occurrence of the state of distortion, the height of the semiconductor wafer, a result of the edge electric field adjustment, and the like are output as, for example, an alert display and a log. Thereafter, the adjustment treatment of the charged particle beam device 1 is executed in step S109 according to the result measured in step S106, the inspection and measurement treatments are executed in step S108, and the treatments are ended in step S110.

According to the above-described operations, even when a state of clogging of foreign matter or distortion occurs in the semiconductor wafer that is the object 4, it is possible to determine each state, perform adjustment according to the state, and execute the inspection and measurement treatments in the same manner as in the case of the normal state. As a result, even when the object 4 is in an abnormal state, it is possible to improve the accuracy of measurement and processing.

<<Edge Electric Field Adjustment>>

Next, the edge electric field adjustment executed in step S106 will be described. FIG. 5 is a diagram illustrating the edge electric field adjustment according to the first embodiment. FIG. 5 illustrates a portion related to the electrode 11$p$ in the electrostatic chuck 11_21. A high voltage is supplied from the voltage generation unit 100 as described in FIG. 2 to the electrode 11$p$. In addition, in FIG. 5, the current measurement unit 101 indicated in FIG. 1 is omitted. In FIG. 5, 1003 indicates an edge electric field adjustment electrode disposed at a peripheral portion of the insulator of the electrostatic chuck 11_21, and 1004 indicates a power supply for the edge electric field adjustment electrode. The power supply for the edge electric field adjustment electrode 1004 is constituted of a voltage source 1001 and an output resistance 1002 for current limitation, and the voltage source 1001 and the output resistance 1002 are connected in series between the edge electric field adjustment electrode 1003 and the ground voltage Vs. In addition, the polarity of the voltage source 103 connected to the electrode 11$p$ via the output resistance is opposite to the polarity of the voltage source 1001 connected to the edge electric field adjustment electrode 1003 via the output resistance.

FIG. 5 illustrates that the semiconductor wafer that is the object 4 is in close contact with the electrostatic chuck 11_21, but when distortion occurs, for example, an end portion (peripheral portion) of the semiconductor wafer is lifted from the electrostatic chuck 11_21 as illustrated in FIG. 11. Accordingly, a bias is generated in the electric field at the end portion of the semiconductor wafer. By supplying a voltage from the power supply for the edge electric field adjustment electrode 1004 to the edge electric field adjustment electrode 1003, the electric field is controlled such that the bias of the electric field generated at the end portion of the semiconductor wafer becomes uniform. That is, in step S106, the output voltage of the power supply for the edge electric field adjustment electrode 1004 is controlled so as to have a value corresponding to the distortion of the semiconductor wafer. Accordingly, it is possible to reduce the bias of the electric field caused by the distortion.

<First Modification>

FIG. 2 illustrates an example in which the current waveform simulation unit 111 and the like are configured with an analog circuit, but this modification is not limited thereto. In a first modification, a state determination unit configured with a digital circuit is provided.

Figure 6:
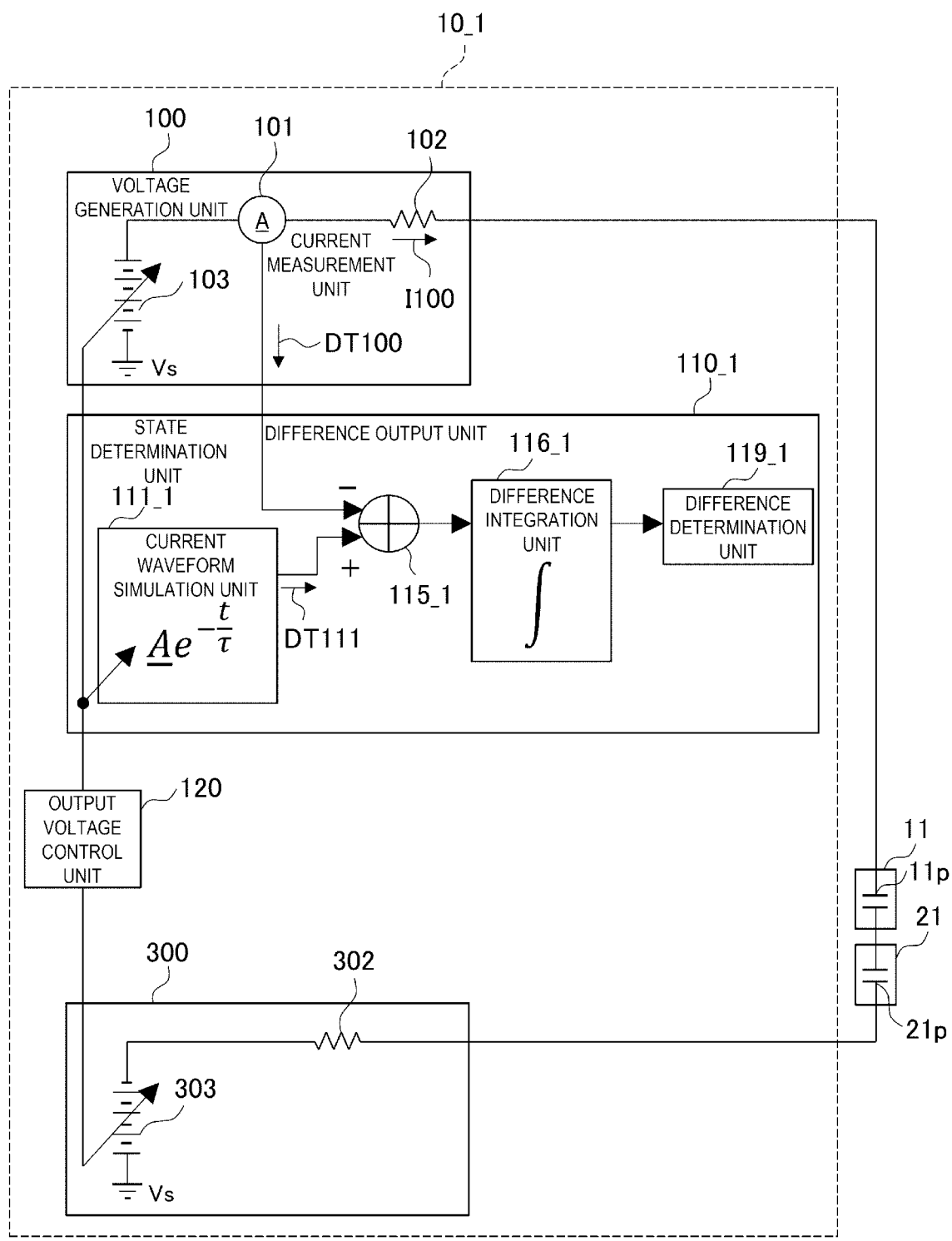
FIG. 6 is a block diagram illustrating a configuration of a high voltage generation device according to a first modification of the first embodiment.

FIG. 6 is a block diagram illustrating a configuration of a high voltage generation device according to the first modification of the first embodiment. FIG. 6 is similar to FIG. 2. Main differences are that the state determination unit is changed to have a reference sign of 110_1, and that the reference sign of the high voltage generation device is changed to 10_1 according to the change of the state determination unit.

The state determination unit 110_1 includes a current waveform simulation unit 111_1 configured with a digital arithmetic circuit, a difference output unit 115_1 configured with a digital addition and subtraction circuit, a difference integration unit 116_1 configured with a digital arithmetic circuit, and a difference determination unit 119 configured with the digital circuit.

The digital arithmetic circuit configuring the current waveform simulation unit 111_1 executes the arithmetic operation indicated in FIG. 6. Here, A indicates a constant, τ indicates a time constant, and t indicates time. By adjusting the constant A, the current waveform simulation unit 111_1 outputs the simulation signal DT111 that changes in time series similarly to the measurement signal DT100 in the normal state. The digital addition and subtraction circuit configuring the difference output unit 115_1 executes subtraction between the measurement signal DT100 and the simulation signal DT111, and supplies a difference to the difference integration unit 116_1. The digital arithmetic circuit configuring the difference integration unit 116_1 executes integration of the supplied difference, and supplies a result thereof to a difference determination unit 119_1. The difference determination unit 119_1 compares a predetermined digital threshold with the integration result. Accordingly, it is also possible to determine the state of the object 4 (clogging of foreign matter, distortion, or the like), execute the adjustment treatment according to the state, and execute the inspection and measurement treatment in a similar manner as in the normal state by the state determination unit 110_1 configured with a digital circuit.

FIG. 6 illustrates an example in which the digital arithmetic circuit is used as the current waveform simulation unit 111_1, but the invention is not limited thereto. For example, the current waveform simulation unit 111_1 may be configured with a digital memory. In this case, a waveform that changes in time series in a similar manner as that of the measurement signal DT100 in the normal state may be stored in the memory, and may be read as the simulation signal DT111 in synchronization with the measurement signal DT100.

Further, the digital arithmetic and the like described in FIG. 6 may be implemented by software such as a program. In this case, for example, one processor that executes a program functions as the current waveform simulation unit 111_1, the difference output unit 115_1, the difference integration unit 116_1, and the difference determination unit 119_1.

<Second Modification>

In the configuration indicated in FIG. 2, a comparison between the integration value output from the difference integration unit 116 and the threshold is performed in continuous time. In a second modification, the comparison between the integration value and the threshold is performed at regular time intervals.

Figure 7:
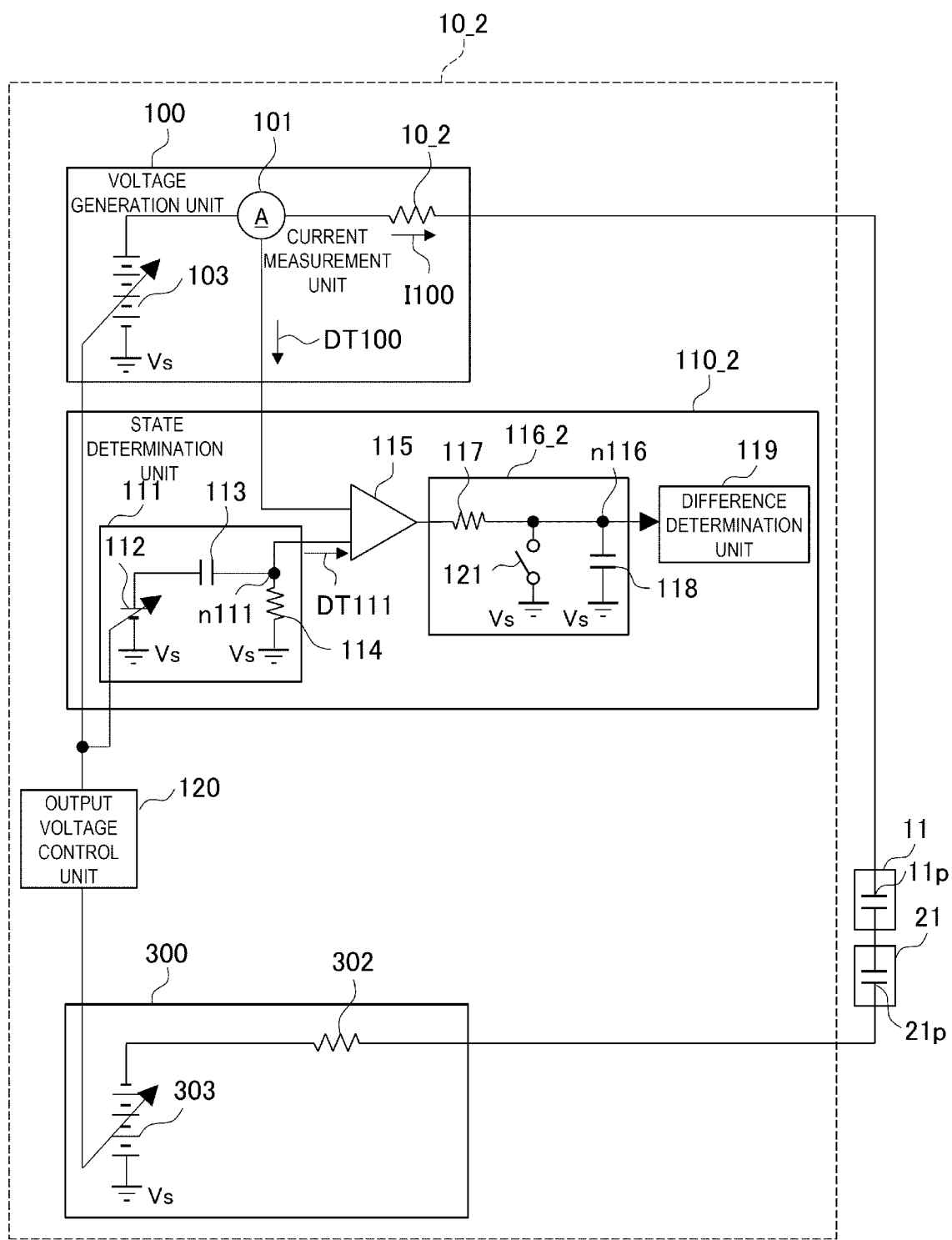
FIG. 7 is a block diagram illustrating a configuration of a high voltage generation device according to a second modification of the first embodiment.

FIG. 7 is a block diagram illustrating a configuration of a high voltage generation device according to the second modification of the first embodiment. FIG. 7 is similar to FIG. 2. Main differences between FIG. 7 and FIG. 2 are that the difference integration unit 116 is changed and the reference sign is 116_2, and that the reference sign of the state determination unit is 110_2 and the reference sign of the high voltage generation device is 10_2 according to the change of the difference integration unit 116_2.

In the difference integration unit 116_2 according to the second modification, a reset switch 121 is added between the connection node n116 and the ground voltage Vs. By turning on the switch 121 at regular time intervals, it is possible to divide the output of the difference integration unit 116_2 at regular time intervals and compare the output with the threshold at regular time intervals.

Figure 8A:
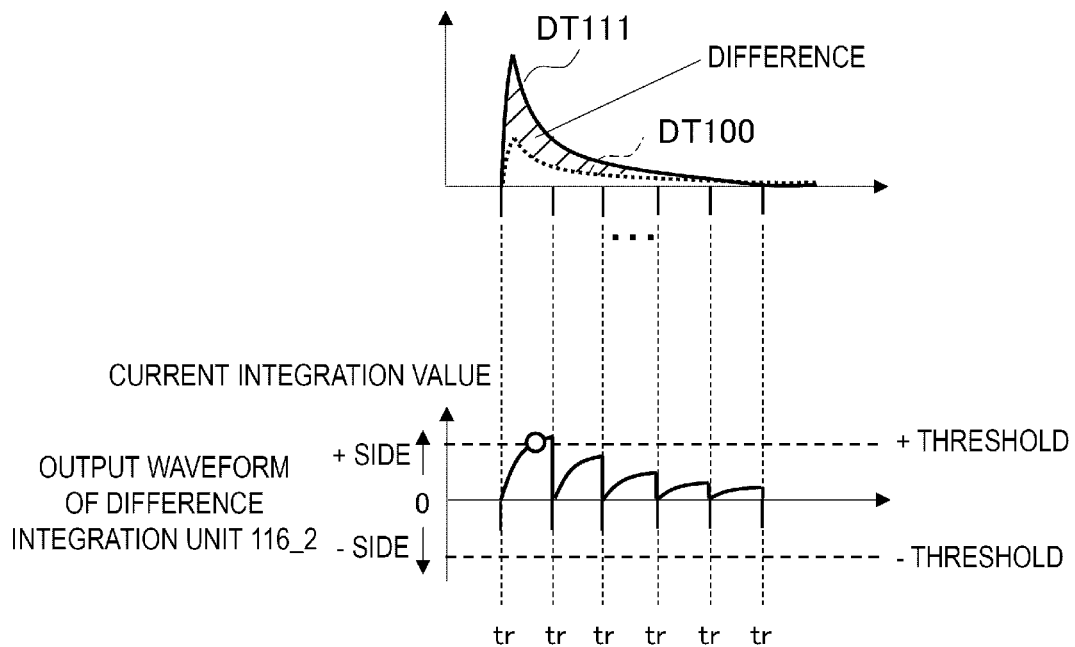
FIGS. 8A and 8B are diagrams illustrating operations of the high voltage generation device according to the second modification of the first embodiment.
Figure 8B:
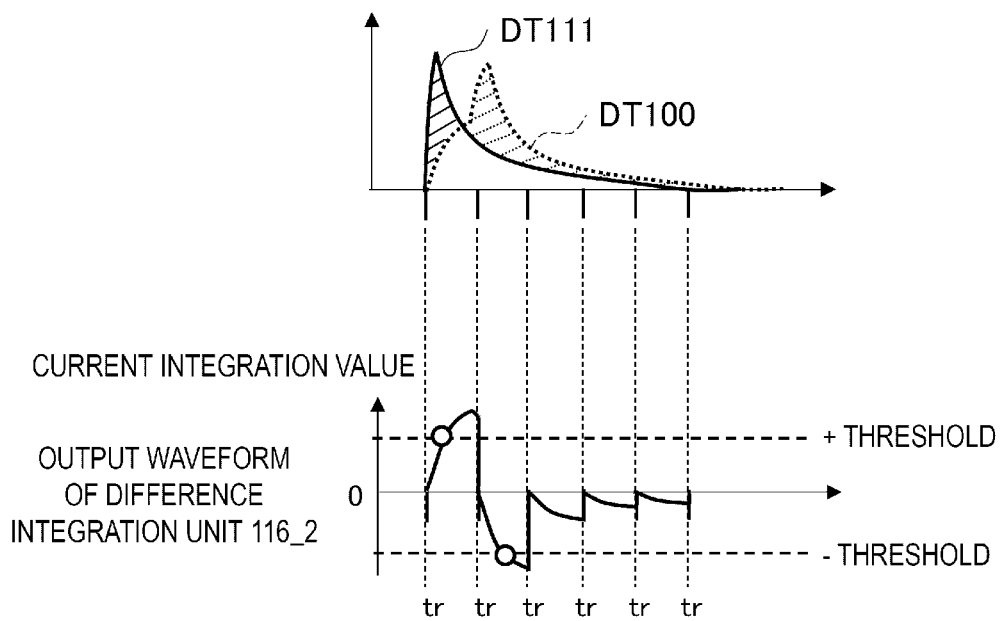

FIGS. 8A and 8B are diagrams illustrating operations of the high voltage generation device according to the second modification of the first embodiment. Here, FIG. 8A illustrates operations at the time of clogging of foreign matter, and FIG. 8B illustrates operations at the time of distortion.

In FIGS. 8A and 8B, tr indicates a timing (a reset timing) at which the switch 121 is turned on and the output is reset. Since the charge of the capacitor 118 is discharged or charged by turning on the switch 121 at the reset timing tr, the voltage of the connection node n116, that is, the output of the difference integration unit 116_2 is reset to 0. When the switch 121 changes to an OFF state, the difference integration unit 116_2 starts integration again from 0 according to the output from the difference output unit 115, and the output changes.

The difference determination unit 119 performs comparison with the threshold at each time divided by the reset timing tr.

In the case of clogging of foreign matter indicated in FIG. 8A, the amplitudes of the measurement signal DT100 and the simulation signal DT111 are not reversed in the time-series change. That is, in FIG. 8A, the amplitude of the simulation signal DT111 is larger than the amplitude of the measurement signal DT100 even after a lapse of time. Therefore, there is a feature that the output of the difference integration unit 116_2 always changes only to the +side (one side) after being reset to 0 at the reset timing tr.

On the other hand, in the case of the distortion indicated in FIG. 8B, the amplitudes of the measurement signal DT100 and the simulation signal DT111 are reversed in the time-series change. Therefore, there is a feature that the output of the difference integration unit 116_2 is reset to 0 at the reset timing tr, changes to the +side (one side), and then changes to the −side (the other side) after being reset to 0 at the next reset timing tr. According to these features, the difference determination unit 119 determines that clogging of foreign matter occurs when the supplied integration value exceeds the +threshold once or more and does not exceed the −threshold. Meanwhile, the difference determination unit 119 determines that distortion occurs when the integration value exceeds the +threshold once or more and then exceeds the −threshold once or more.

As described above, according to the second modification, it is possible to more reliably determine the state of the object 4 by using the two thresholds.

Second Embodiment

Figure 9:
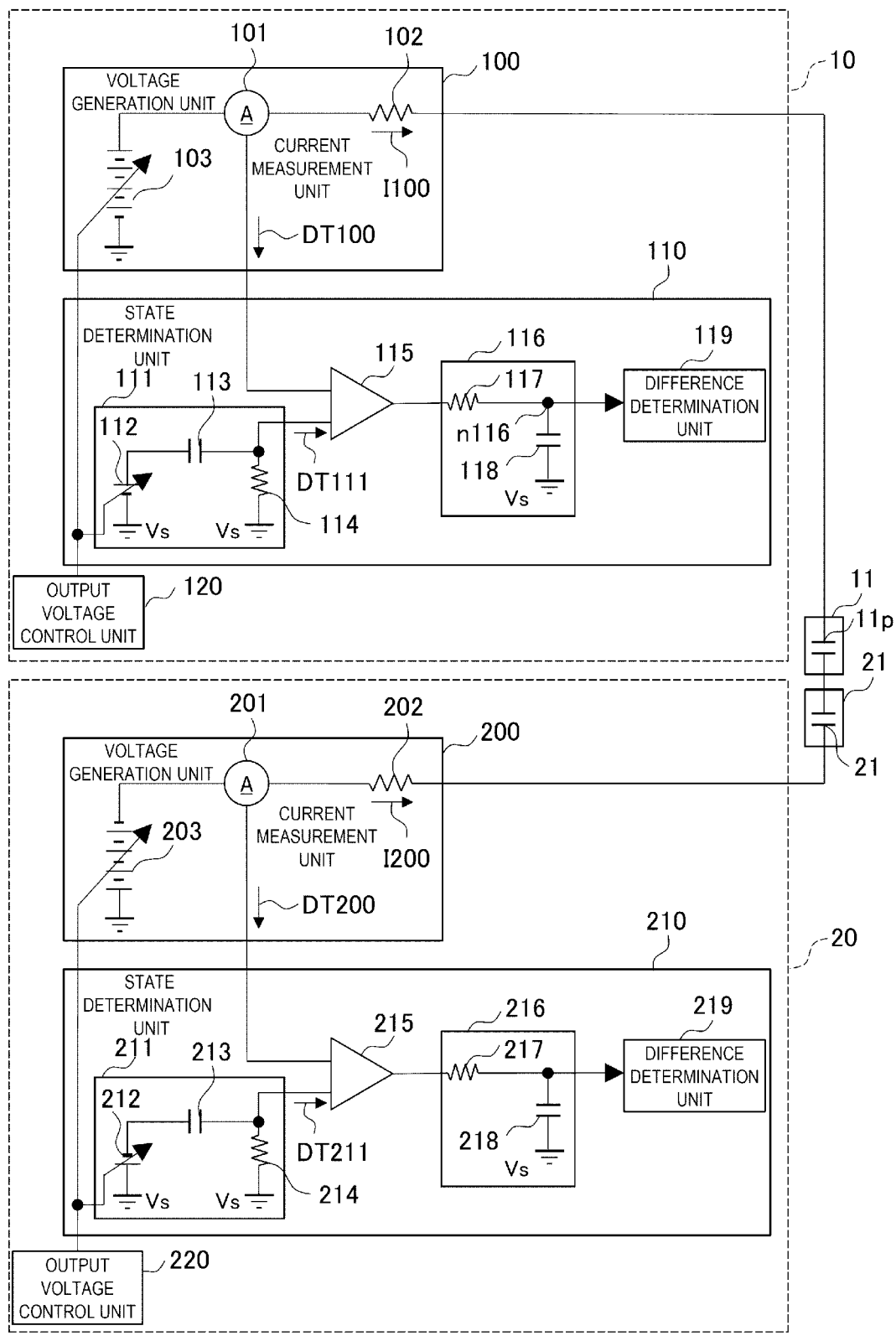
FIG. 9 is a block diagram illustrating a configuration of a charged particle beam device according to a second embodiment.

FIG. 9 is a block diagram illustrating a configuration of a charged particle beam device according to a second embodiment. The charged particle beam device according to the second embodiment includes a negative high voltage generation device 20 that generates a negative high voltage, in addition to the high voltage generation device 10 described in the first embodiment.

The configuration of the negative high voltage generation device 20 is similar to that of the high voltage generation device 10. That is, the negative high voltage generation device 20 corresponds to the voltage generation unit 100, and includes a voltage generation unit (a second voltage generation unit) 200 including a voltage source 203, a current measurement unit 201, and an output resistance 202, a state determination unit (a second state determination unit) 210 corresponding to the state determination unit 110, and an output voltage control unit 220 corresponding to the output voltage control unit 120.

Here, the state determination unit 210 includes a current waveform simulation unit (a second current waveform simulation unit) 211 corresponding to the current waveform simulation unit 111 and including a voltage source 212, a capacitor 213, and a resistance 214, and a difference output unit (a second difference output unit) 215 corresponding to the difference output unit 115. Further, the state determination unit 210 includes a difference integration unit (a second difference integration unit) 216 corresponding to the difference integration unit 116 and including a resistance 217 and a capacitor 218, and a difference determination unit (a second difference determination unit) 219 corresponding to the difference determination unit 119. Further, the negative high voltage from the negative high voltage generation device 20 is supplied to the −electrode 21p of the electrostatic chuck 11_21 instead of the negative voltage generation unit 300 (FIG. 2). In addition, it may be considered that the high voltage generation device 10 and the negative high voltage generation device 20 constitute a high voltage generation device that supplies positive and negative high voltages to the electrostatic chuck 11_21.

A main difference between the high voltage generation device 10 and the negative high voltage generation device 20 is that the polarities of the voltage sources 203 and 212 are opposite to those of the voltage sources 103 and 112. That is, the negative electrode of the voltage source 203 is connected to the −electrode 21p via the current measurement unit 201, and the negative electrode of the voltage source 212 is connected to the connection node n211 corresponding to the connection node n111 via the capacitor 213.

Similar to the simulation signal DT111 in the high voltage generation device 10, the simulation signal DT211 in the negative high voltage generation device 20 changes in time series in a similar manner as the measurement signal DT200 in the normal state in a form in which the positive and negative of the simulation signal DT211 are inverted.

Figure 10:
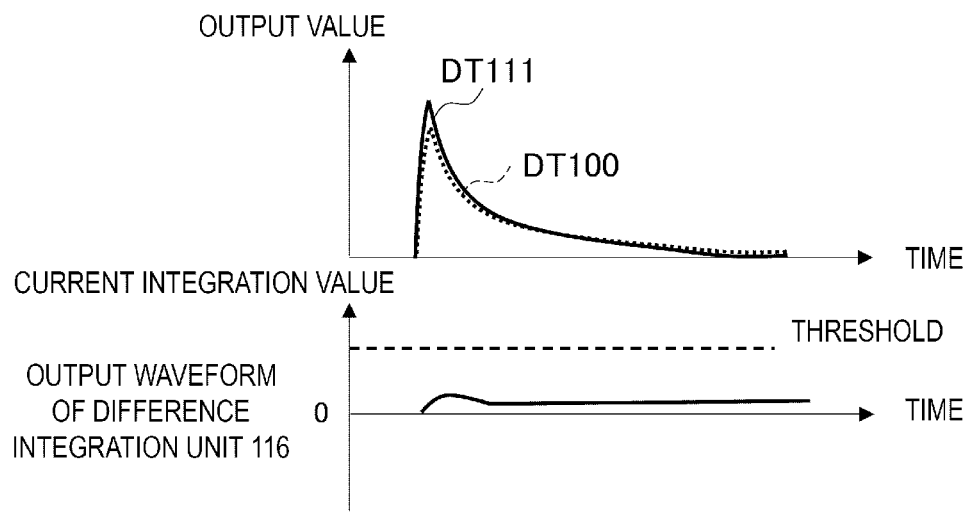
FIG. 10 is a diagram illustrating a high voltage generation device and a negative high voltage device according to the second embodiment.
Figure 10:
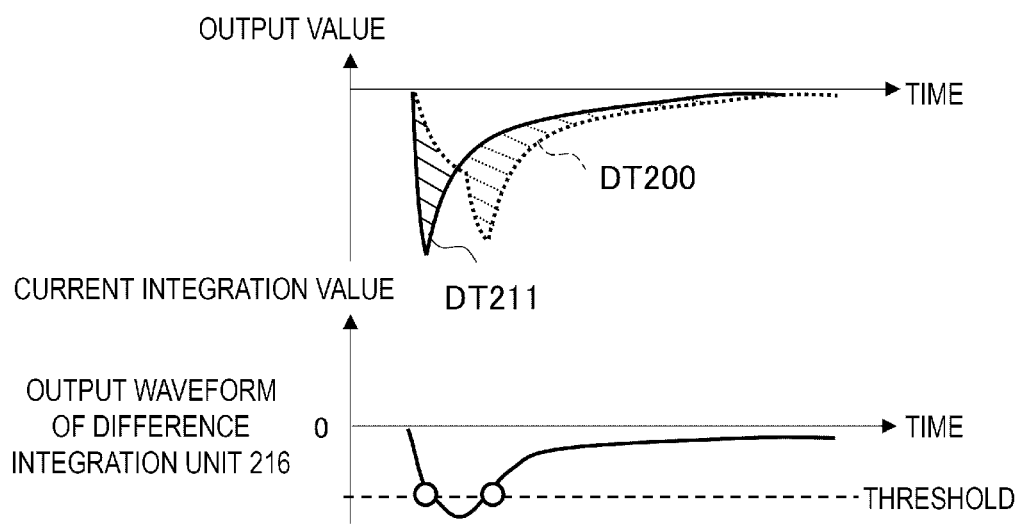

FIG. 10 is a diagram illustrating the high voltage generation device and the negative high voltage device according to the second embodiment. FIG. 10 illustrates a case where an unintended film is formed on a back surface of the semiconductor wafer that is the object 4. Here, the back surface indicates a main surface of the semiconductor wafer in contact with the insulator of the electrostatic chuck 11_21. In this case, as indicated in FIG. 10, the peak appearance timing of the current waveform differs between the high voltage generation device 10 that outputs a positive voltage and the negative high voltage generation device 20 that outputs a negative voltage. That is, the simulation signal DT111 and the measurement signal DT100 are substantially equal to each other, and thus a peak exceeding the threshold does not occur. On the other hand, the timing at which the peak occurs differs between the simulation signal DT211 and the measurement signal DT200.

Accordingly, it is also possible to determine a state in which a film is formed on the back surface, in addition to the state of the object 4 described in the first embodiment.

As described above, the invention made by the inventor is specifically described based on the embodiments, but it is needless to say that the invention is not limited to the above-described embodiments, and various modifications can be made without departing from the gist of the invention.

What is claimed is:

1. A charged particle beam device comprising:
   an electrostatic chuck configured to adsorb an inspection object;
   a first voltage generation unit configured to generate a voltage to be supplied to the electrostatic chuck; and
   a first state determination unit configured to determine a state of the inspection object, wherein
   the first state determination unit includes
   a first current waveform simulation unit configured to simulate a time-series change of an electrostatic chuck current flowing through the first voltage generation unit when the electrostatic chuck normally adsorbs the inspection object,
   a first difference integration unit configured to acquire an integration value of a difference between a time-series change of a simulation current generated by the first current waveform simulation unit and a time-series change of the electrostatic chuck current flowing through the first voltage generation unit, and
   a first determination unit configured to determine a state of the inspection object at the time of adsorption and a shape feature of the inspection object based on the integration value of the difference.

2. The charged particle beam device according to claim 1 further comprising:
   a display unit configured to display a shape feature of the inspection object or output a log.

3. The charged particle beam device according to claim 1, wherein
   the first current waveform simulation unit includes a CR differentiation circuit or an RL differentiation circuit, and the time-series change of the simulation current is generated by the CR differentiation circuit or the RL differentiation circuit, and
   the first difference integration unit includes an RC integration circuit or an LR integration circuit, and the integration value of the difference is generated by the RC integration circuit or the LR integration circuit.

4. The charged particle beam device according to claim 3, wherein
   the integration value of the difference is acquired at regular time intervals.

5. The charged particle beam device according to claim 1, wherein
   each of the first current waveform simulation unit and the first difference integration unit is configured with a digital circuit.

6. The charged particle beam device according to claim 1 further comprising:
   a second voltage generation unit configured to generate a voltage having a polarity different from the polarity of the voltage generated by the first voltage generation unit and supply the voltage to the electrostatic chuck; and
   a second state determination unit configured to determine the state of the inspection object, wherein
   the second state determination unit includes
   a second current waveform simulation unit configured to simulate a time-series change of an electrostatic chuck current flowing through the second voltage generation unit when the electrostatic chuck normally adsorbs the inspection object, a second difference integration unit configured to acquire an integration value of a difference between a time-series change of a simulation current generated by the second current waveform simulation unit and the time-series change of the electrostatic chuck current flowing through the second voltage generation unit, and a second determination unit configured to determine the state of the inspection object at the time of adsorption and a shape feature of the inspection object based on the integration value of the difference.

7. The charged particle beam device according to claim 6, wherein the inspection object is a semiconductor wafer.

\* \* \* \* \*